(12) United States Patent
Aupee et al.

(10) Patent No.: US 12,127,341 B2
(45) Date of Patent: Oct. 22, 2024

(54) MULTILAYER PRINTED CIRCUIT BOARD

(71) Applicant: THALES, Courbevoie (FR)

(72) Inventors: Geoffroy Aupee, Ymare (FR);
Pierre-Yves Michaud, Ymare (FR)

(73) Assignee: THALES, Courbevoie (FR)

( * ) Notice: Subject to any disclaimer, the term of this patent is extended or adjusted under 35 U.S.C. 154(b) by 257 days.

(21) Appl. No.: 17/875,683

(22) Filed: Jul. 28, 2022

(65) Prior Publication Data
US 2023/0032026 A1    Feb. 2, 2023

(30) Foreign Application Priority Data

Jul. 29, 2021   (FR) ..................................... 2108248

(51) Int. Cl.
| | |
|---|---|
| *H05K 1/02* | (2006.01) |
| *H05K 1/18* | (2006.01) |
| *H05K 3/00* | (2006.01) |
| *H05K 3/04* | (2006.01) |
| *H05K 3/10* | (2006.01) |
| *H05K 3/42* | (2006.01) |
| *H05K 3/46* | (2006.01) |

(52) U.S. Cl.
CPC ........... *H05K 1/0298* (2013.01); *H05K 1/181* (2013.01); *H05K 3/10* (2013.01); *H05K 3/42* (2013.01); *H05K 3/4697* (2013.01); *H05K 3/0094* (2013.01); *H05K 3/04* (2013.01); *H05K 2201/09372* (2013.01)

(58) Field of Classification Search
CPC ...... H05K 1/0298; H05K 1/115; H05K 1/181; H05K 3/0094; H05K 3/04; H05K 3/10; H05K 3/42; H05K 3/4697; H05K 2201/09372
See application file for complete search history.

(56) References Cited

U.S. PATENT DOCUMENTS

| | | | |
|---|---|---|---|
| 7,364,461 | B1 | 4/2008 | Back |
| 10,973,122 | B1 | 4/2021 | Benedict |
| 2016/0150633 | A1 | 5/2016 | Cartier, Jr. |

*Primary Examiner* — Nathan Milakovich
(74) *Attorney, Agent, or Firm* — BakerHostetler (57) ABSTRACT

Embodiments provide a multilayer printed circuit board intended to connect electronic components, the board comprising a stack of a plurality of conductive layers, the conductive layers comprising two surface layers and one or more internal layers, the board comprising one or more counterbored holes, each counterbored hole comprising a portion with metallization opening onto one of the two surface layers and a portion without metallization opening onto the other surface layer; the multilayer printed circuit board may advantageously comprise one or more metal pads, each metal pad being joined to one of the two surface layers so as to occult the portion without metallization of a corresponding counterbored hole.

9 Claims, 9 Drawing Sheets

MULTILAYER PRINTED CIRCUIT BOARD

CROSS-REFERENCE TO RELATED APPLICATION

This application claims priority to foreign French patent application No. FR 2108248, filed on Jul. 29, 2021, the disclosure of which is incorporated by reference in its entirety.

FIELD OF THE INVENTION

The present invention generally relates to printed circuit boards for electronic systems and in particular to a multilayer printed circuit board and to a process for manufacturing the multilayer printed circuit board.

BACKGROUND

Electronic systems conventionally implement complex processing operations that have an impact on the bulk and power consumption of such systems. For example, the operation of an electronic system of radar type is generally based on generated electromagnetic signals that are transmitted through space by means of a transmitting module equipped with a dedicated antenna. The radar further comprises a receiving module intended to detect electromagnetic signals reflected by targets, and a processing module intended to determine, on the basis of the detected signals, information relative to the targets such as their position and their speed of movement.

Radars may be fixed on the ground, located on-board a ground vehicle or on a ship or boat, or be airborne by means of an aircraft. In every case, the radar must meet many constraints related, in particular, to bulk. Specifically, in the field of AESA radars for example (AESA standing for Active Electronically Scanned Array), functionalities are increasingly being integrated into the antenna portion of the radar. Initially limited to microwave functions (transmission and reception of signals and ancillaries), the antenna portion of the radar is now expected to host an ever-increasing percentage of the digital processing operations applied to signals. In parallel, the radar must be capable of implementing more and more functionalities in order to adapt to the targets of interest, which are increasingly small and/or manoeuvrable.

In order to meet bulk constraints in a radar, it is known to use one or more single-layer printed circuit boards each comprising a plurality of electronic components. The electronic components of a given printed circuit board are electrically connected by means of electrical tracks and according to a given circuit diagram so as to perform electronic functions on the various signals required in the operation of the radar. Such electronic functions comprise, for example and non-limitingly, generation of signals, filtering, modulation and frequency transposition. Thus, the electrical signals transported by the electrical tracks of a single-layer printed circuit board may be of various forms (digital or analogue), of various frequencies (baseband signals and radio-frequency signals) and/or of various powers. However, the dimensions of a single-layer printed circuit board are strongly related to the number and the length of the electrical tracks connecting the various electronic components arranged on the single-layer printed circuit board. This makes single-layer printed circuit boards incompatible with current day radars that incorporate a significant number of electronic functions requiring a significant number of electronic components.

In order to mitigate the limitations related to the use of a single-layer printed circuit board in a radar, it is known to use a multilayer printed circuit board comprising a stack of a plurality of layers (two surface layers and one or more internal layers). In this case, an electronic component may be connected to other electronic components by means of electrical tracks produced in one or more layers of the multilayer printed circuit board. To do this, metallized holes are generally used to ensure the electrical connection between the various layers of the multilayer printed circuit board. For example, a metallized through-hole may be used to electrically connect all the layers of the multilayer printed circuit board. It is also known to use a metallized counterbored hole to electrically connect one of the two surface layers to one or more internal layers. Generally, a counterbored hole is produced from a metallized through-hole by removing unused or unuseful metallization responsible for certain effects that result in reflection and/or distortion of useful signals. However, in certain cases, the counterbore may be the origin of parasitic electromagnetic radiation that may locally degrade the operation of certain electronic components employed in the multilayer printed circuit board.

Figure 1:
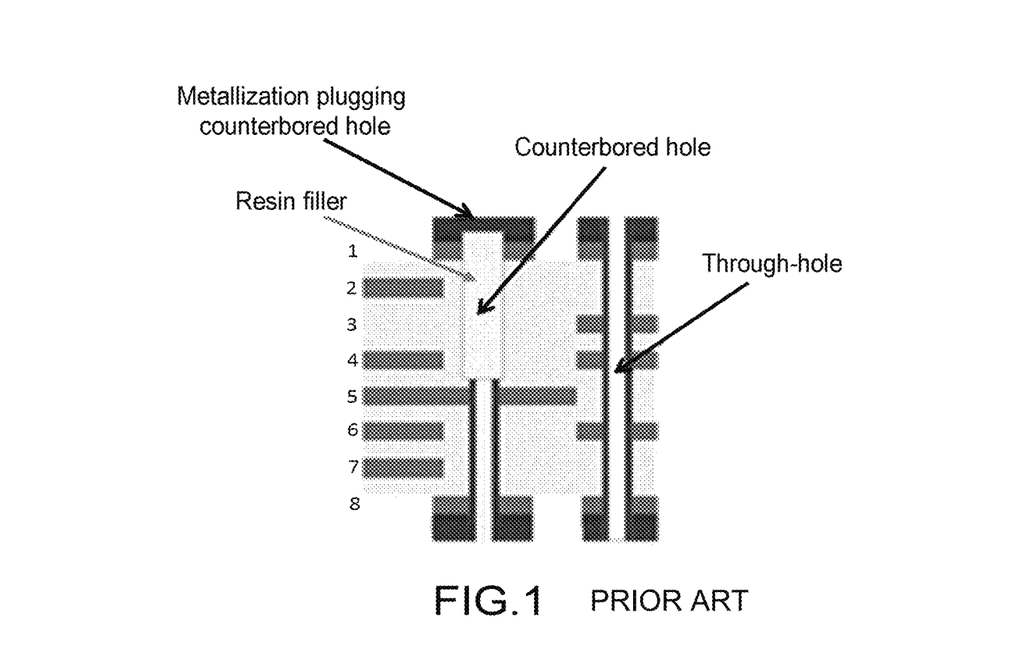
FIG. 1 illustrates a counterbored hole, according to a prior-art solution.

One known solution for preventing parasitic electromagnetic radiation is illustrated in FIG. 1. Such a known solution consists in filling each counterbored hole with an electrically non-conductive resin, and in plugging the counterbored hole thus filled with a metallization deposited using a process similar to that employed to produce the metal interconnect tracks between surface-mount electronic components. However, such a known solution is complex to implement and considerably decreases the manufacturing yield of the multilayer printed circuit boards. Specifically, the resin filler may easily penetrate into other types of metallized holes such as the metallized through-holes, and hence additional steps are required to free them from resin. Furthermore, the production of the plugging metallizations requires additional metal layers to be deposited on the surface layers of the multilayer printed circuit board, the final metallization thickness becoming large as a result and decreasing the thinness and etching tolerances.

Thus, there is a need for an improved multilayer printed circuit board.

SUMMARY OF THE INVENTION

To this end, the present invention provides a multilayer printed circuit board intended to connect electronic components, the multilayer printed circuit board comprising a stack of a plurality of conductive layers, the conductive layers comprising two surface layers and one or more internal layers, separation between two neighbouring conductive layers being ensured by means of an electrically insulating layer, the printed circuit board comprising one or more counterbored holes, each counterbored hole being configured to electrically connect one of the two surface layers to one or more internal layers and comprising a portion with metallization opening onto one of the two surface layers and a portion without metallization opening onto the other surface layer, the portion with metallization and the portion without metallization of a counterbored hole extending in a direction perpendicular to a layer stacking plane. Advantageously, the multilayer printed circuit board further comprises one or more metal pads, each metal pad being joined to one of the two surface layers so as to occult the portion without metallization of a corresponding counterbored hole.

In one embodiment, parasitic electromagnetic radiation is liable to form inside the counterbored holes, and the metal pads may be chosen so as to block, at least partially, propagation of the parasitic electromagnetic radiation out of the counterbored holes.

In another embodiment, parasitic electromagnetic radiation is liable to penetrate into the counterbored holes, and the metal pads may be chosen so as to block, at least partially, propagation of the parasitic electromagnetic radiation into the counterbored holes.

Advantageously, geometric properties of a metal pad may be chosen depending on one or more characteristics of the parasitic electromagnetic radiation liable to form in and/or penetrate into the corresponding counterbored hole.

As a variant, electrical properties of a metal pad may be chosen depending on one or more characteristics of the parasitic electromagnetic radiation liable to form in and/or penetrate into the corresponding counterbored hole.

In one embodiment, the metal pads may be identical.

In another embodiment, the metal pads may be passive components not requiring an electrical power supply.

A process is further provided for manufacturing a multilayer printed circuit board and adding components, the multilayer printed circuit board being intended to connect electronic components. Advantageously, the process comprises the steps of:
  producing a stack of a plurality of conductive layers, the conductive layers comprising two surface layers and one or more internal layers, separation between two neighbouring conductive layers being ensured by means of an insulating layer;
  producing electrical connections between the conductive layers by means of one or more metallized through-holes;
  converting at least one metallized through-hole into a counterbored hole, the counterbored hole comprising a portion with metallization opening onto one of the two surface layers and a portion without metallization opening onto the other surface layer, the portion with metallization and the portion without metallization of a counterbored hole extending in a direction perpendicular to a layer stacking plane;
  producing electrical tracks and connection pads on at least one of the two surface layers.

Advantageously, the process for manufacturing a multilayer printed circuit board and adding components may further comprise steps of:
  joining one or more metal pads to one or both surface layers, each metal pad being joined so as to occult the portion without metallization of a corresponding counterbored hole;
  joining one or more electronic components to connection pads belonging to one or both surface layers.

DETAILED DESCRIPTION

Other features and advantages of the invention will become apparent from the following description and from the figures, in which.

DETAILED DESCRIPTION

The multilayer printed circuit board 10 according to various embodiments of the invention is intended to electrically connect electronic components 304 and to allow them to exchange electrical signals of various forms (digital or analogue), of various frequencies (baseband signals and radio-frequency signals) and/or of various powers.

Figure 2:
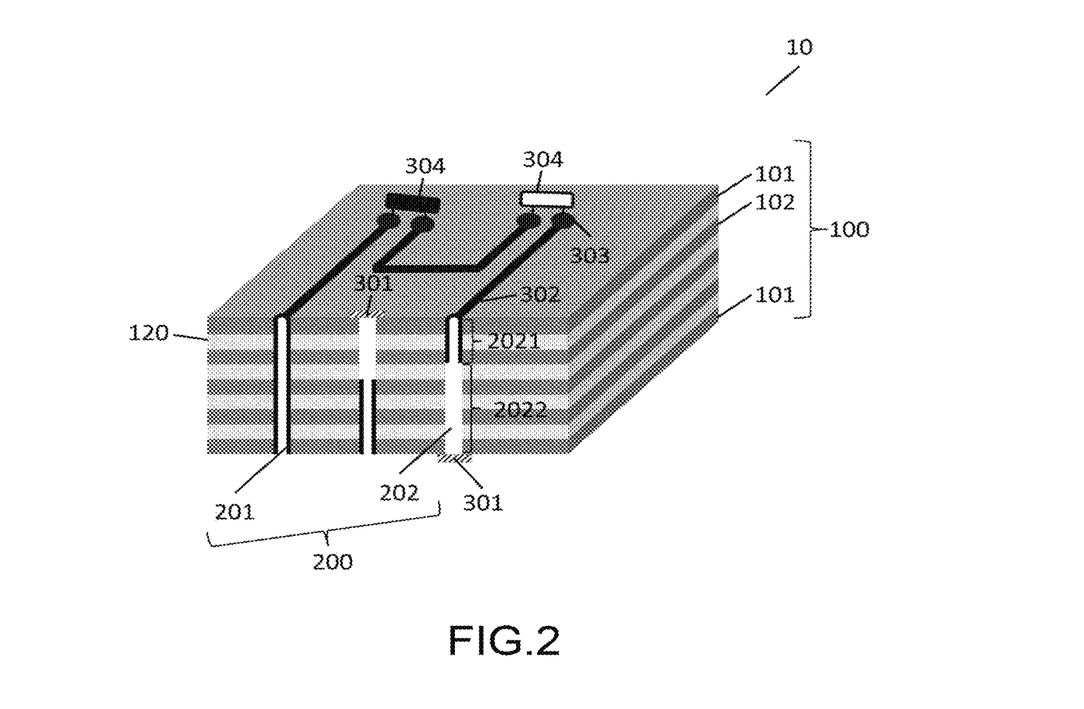
FIG. 2 shows a multilayer printed circuit board, according to embodiments of the invention.

FIG. 2 shows a multilayer printed circuit board 10, according to embodiments of the invention. The multilayer printed circuit board 10 comprises a stack of a plurality of conductive layers 100, separation between two neighbouring conductive layers 100 being ensured by means of an electrically insulating layer 120 based on one or more insulating materials. The conductive layers 100 comprise two surface layers 101 and one or more internal layers 102. Moreover, each of the conductive layers 100 comprises a set of electrical tracks 302 intended to connect electronic components 304 added, i.e. soldered, to one or more conductive layers 100 of the multilayer printed circuit board 10. The multilayer printed circuit board 10 further comprises one or more connection holes 200, also called vias, allowing electrical connections to be made between the various conductive layers 100 of the multilayer printed circuit board 10. For example, the electrical tracks 302 conjointly with the connection holes 200 allow an electrical connection to be made between two electronic components 304 added to a given layer or added to two different layers of the multilayer printed circuit board 10. Moreover, the multilayer printed circuit board 10 comprises at least one counterbored hole 202. A counterbored hole 202 allows one of the two surface layers 101 to be connected to one or more internal layers 102 and, to this end, comprises a portion with metallization 2021 that passes perpendicularly through the conductive layers 100 to be connected and opens onto, i.e. terminates on, the surface layer 101 in question. The counterbored hole 202 further comprises a portion without metallization 2022 that passes through the other conductive layers 100 and opens onto the other surface layer 101. From an industrial point of view, a counterbored hole 202 may be obtained by first producing a metallized through-hole 201 the internal surface of which is completely metallized, i.e. covered by a metal, before one portion of the internal metallization is removed in a direction perpendicular to the layer stacking plane. In the embodiments of the invention, the multilayer printed circuit board 10 further comprises one or more metal pads 301. Each of the metal pads 301 is added to one of the two surface layers 101 so as to occult the portion without metallization 2022 of a corresponding counterbored hole 202. Each metal pad 301 is an isolating metal pad capable of blocking parasitic electromagnetic radiation.

Each layer of the multilayer printed circuit board 10 further comprises connection pads 303 that correspond, for example, to terminations of the electrical tracks 302 of the conductive layer 100 in question. A connection pad 303 may be perforated with a view to making an electrical connection between two or more conductive layers 100 by means of a via or to making an electrical connection between electronic components 304. Alternatively, a connection pad 303 may not be perforated and rather be intended to solder surface-mount electronic components 304.

In embodiments of the invention, parasitic electromagnetic radiation is liable to form inside a counterbored hole 202. The origin of such parasitic electromagnetic radiation may, for example and non-limitingly, be the portion with metallization 2021 of the counterbored hole 202, which may act as an antenna radiating the electromagnetic waves that pass therethrough. In such embodiments of the invention, the metal pad 301 occulting the counterbored hole 202 is chosen so as to block, at least partially, propagation of such parasitic electromagnetic radiation out of the corresponding counterbored hole 202. Advantageously, each metal pad 301 employed in the multilayer printed circuit board 10 is chosen so as to completely block propagation of parasitic electromagnetic radiation out of the corresponding counterbored hole 202.

In other embodiments of the invention, parasitic electromagnetic radiation is liable to form outside a counterbored hole 202. In such embodiments of the invention, the metal pad 301 occulting the counterbored hole 202 is chosen so as to block, at least partially, penetration of such parasitic electromagnetic radiation into the corresponding counterbored hole 202.

Advantageously, the metal pads 301 occulting the counterbored holes 202 of the multilayer printed circuit board 10 may be identical, i.e. the metal pads 301 may have the same geometric properties, and in particular the same thickness, thickness being measured perpendicular to the layer stacking plane.

In embodiments of the invention, the geometric properties of a metal pad 301 occulting a counterbored hole 202 may be chosen depending on one or more characteristics of the parasitic electromagnetic radiation liable to form in or outside the corresponding counterbored hole 202. For example, the thickness of a metal pad 301 may be several times larger, and typically one-hundred times larger, than the skin depth associated with the parasitic electromagnetic radiation in question, the skin depth being dependent on the frequency of the parasitic electromagnetic radiation in question.

In other embodiments of the invention, the electrical properties of a metal pad 301 occulting a counterbored hole 202 may be chosen depending on one or more characteristics of the parasitic electromagnetic radiation liable to form in or outside the corresponding counterbored hole 202. Such electrical properties comprise, for example and non-limitingly, the electrical conductivity of the metal pad 301.

Advantageously, the metal pads 301 occulting the counterbored holes 202 of the multilayer printed circuit board 10 are passive components not requiring an electrical power supply. Moreover, a metal pad 301 added to one of the two surface layers 101 of the multilayer printed circuit board 10 may be electrically insulated from all the other metal pads 301 added to the same surface layer 101.

In embodiments of the invention, one or more metal pads 301 may each be uniform in terms of chemical composition, i.e. be composed of a single chemical element that may be a metal such as copper or aluminium. Alternatively, one or more metal pads 301 may each be composed of an alloy of a plurality of chemical elements.

Figure 3:
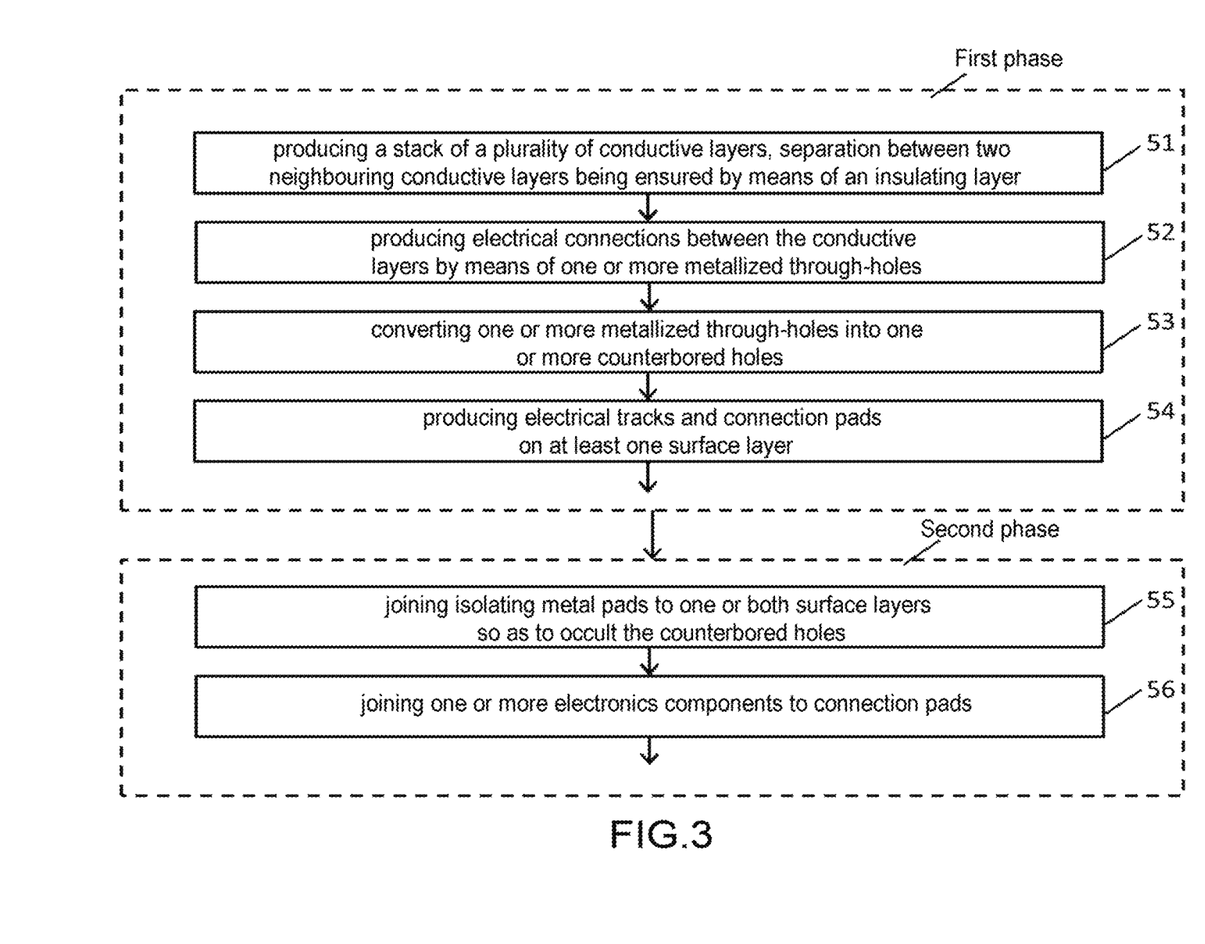
FIG. 3 shows a process for manufacturing a multilayer printed circuit board and adding components, according to embodiments of the invention.

FIG. 3 shows a process for manufacturing a multilayer printed circuit board 10 and adding components, according to embodiments of the invention. The manufacturing process comprises a first phase consisting in manufacturing the multilayer printed circuit board 100 and a second phase consisting in adding metal pads 301 and electronic components 304 to the multilayer printed circuit board 100 thus manufactured. The first phase comprises steps 51 to 54 and the second phase comprises steps 55 and 56, steps 51 to 56 being described below. The manufacturing process according to various embodiments of the invention is applicable to printed circuit boards having any number of conductive layers 100, and typically more than three.

In step 51, a stack of a plurality of conductive layers 100 is produced, separation between two neighbouring conductive layers 100 being ensured by means of an insulating layer 120 based on one or more insulating materials. The conductive layers 100 comprise two surface layers 101 and one or more internal layers 102. Each conductive layer 100, and in particular each internal layer 102, may comprise a set of electrical tracks 302 and a set of connection pads 303 produced beforehand according to a given circuit diagram. Step 301 may furthermore consist in producing electrical connections between the internal layers 102 by means of one or more buried holes and in producing electrical connections between the surface layers 101 and the internal layers 102 by means of one or more blind holes. Generally, a buried or blind hole is obtained by producing a metallized through-hole in a sub-stack of conductive layers 100. For example, the sub-stack of conductive layers 100 of a buried hole comprises only internal conductive layers 102 and their electrically insulating layer 120 of the multilayer printed circuit board 10.

In step 52, electrical connections between the conductive layers 100 are produced by means of one or more metallized through-holes 201. Production of a metallized through-hole 201 consists in boring a hole through all the layers implemented, before depositing a layer of a metal such as copper inside the hole. A metallized through-hole 201 in particular allows all the conductive layers 100 implemented, and in particular the two surface layers 101, to be electrically connected.

In step 53, one or more metallized through-holes 201 are converted into one or more counterbored holes 202 by removing, i.e. getting rid of, unuseful metallization in a direction perpendicular to the stacking plane. Thus, a counterbored hole 202 comprises a portion with metallization 2021 that passes perpendicularly through the conductive layers 100 to be connected and opens onto one of the two surface layers 101. The counterbored hole 202 further comprises a portion without metallization 2022 that passes through the other conductive layers 100 and opens onto the other surface layer 101. It will be noted that the counterbored holes 202 according to the embodiments of the invention are empty, i.e. they are not filled with any resin plug such as described with respect to the solutions of the prior art.

In step 54, electrical tracks 302 and connection pads 303 are produced on one or both surface layers 101 of the multilayer printed circuit board 10.

In step 55, metal pads 301 are joined, i.e. fastened rigidly or added, to one or both surface layers 101 so as to occult the portion without metallization 2022 of each counterbored hole 202. The metal pads 301 may all be identical. Alternatively, at least two metal pads 301 may be different in terms of geometric properties and/or in terms of electrical properties.

In step 56, electronics components 304 are joined to connection pads 303 produced on one or both of the surface layers 101. Those skilled in the art will understand that steps 55 and 56 may be carried out in parallel or sequentially in time.

Figure 4:
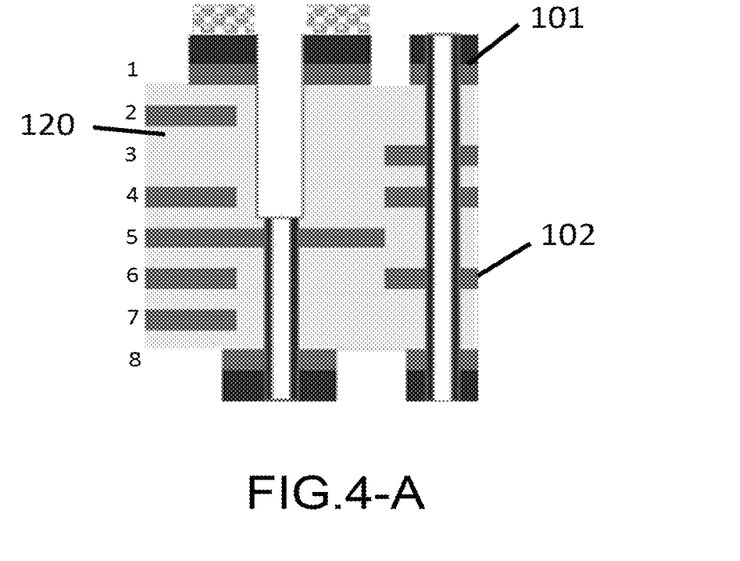
FIGS. 4A to 4C illustrate the steps carried out to join a metal pad to a surface layer of a multilayer printed circuit board, according to embodiments of the invention.

FIGS. 4-A, 4-B and 4-C illustrate the steps carried out to join a metal pad 301 to one of the two surface layers 101 of the multilayer printed circuit board 10 (step 55 described above). More precisely, FIG. 4-A illustrates a first step consisting in depositing a solder paste on a metal portion of the surface layer 101, which is intended to accommodate the metal pad 301, the metal portion possibly, for example and non-limitingly, being a connection pad 303. FIG. 4-B shows a second step consisting in placing the metal pad 301 on the metal portion of the surface layer 101 prepared beforehand. The second step may be carried out manually or automatically using a machine for placing surface-mount components (SMCs). FIG. 4-C illustrates a soldering third step consisting in rigidly fastening the metal pad 301 to the surface layer 101 of the multilayer printed circuit board 10. The soldering step may be carried out using the reflow soldering technique. Moreover, the deposition of the solder paste (first step) and the reflow (third step) may be carried out at the same time for the metal pads 301 and for the electronic components 304.

Figure 5:
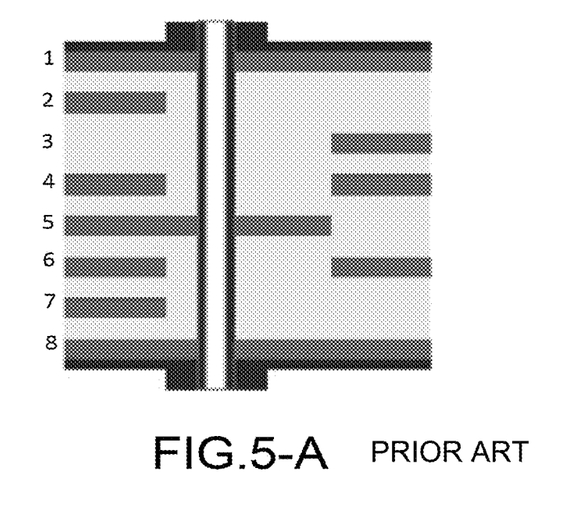
FIGS. 5A to 5G illustrate the steps used to produce a counterbored hole and a through-hole, according to a prior-art solution.
Figure 6:
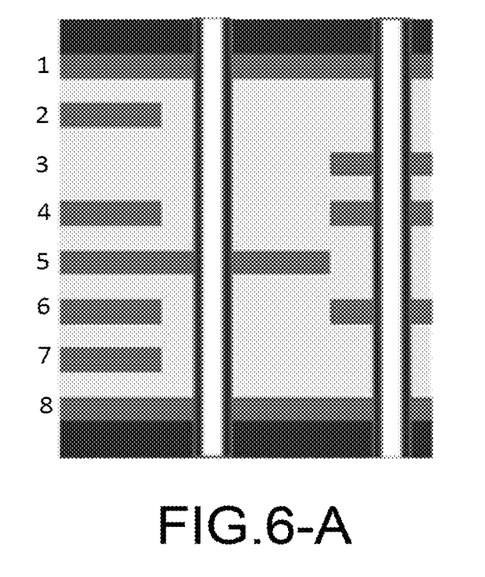
FIGS. 6A to 6D illustrate the steps used to produce a counterbored hole and a through-hole, according to embodiments of the invention.

FIGS. 5-A, 5-B, 5-C, 5-D, 5-E, 5-F and 5-G illustrate production of a counterbored hole 202 and of a metallized through-hole 201 in a multilayer printed circuit board 10 according to a prior-art solution. The prior-art solution consists in filling the counterbored hole 202 with an electrically non-conductive resin before closing the counterbored hole 202 by means of a metallization. FIGS. 6-A, 6-B, 6-C and 6-D illustrate the steps required to produce the counterbored hole 202 and the metallized through-hole 201 according to embodiments of the invention.

FIGS. 5-A and 6-A correspond to a hole-boring and -metallizing step in particular allowing the counterbored hole 202 to be prepared by producing a metallized through-hole 201. More precisely, FIG. 6-A shows that production of a counterbored hole and production of a metallized through-hole 201 may begin in the same manufacturing step with production of two metallized through-holes 201, according to the embodiments of the invention. Moreover, FIG. 5-A shows that the prior-art solution does not privilege such parallelism in the production of a metallized through-hole 201 and of a counterbored hole 202.

FIGS. 5-B and 6-B correspond to a counterboring step consisting in producing a counterbored hole 202 from a metallized through-hole 201. This amounts to removing one portion of the metallization of the metallized through-hole 201 in a direction perpendicular to the layer stacking plane.

FIG. 5-C corresponds to a filling step implemented in the prior-art solution, the filling step consisting in completely filling the counterbored hole 202 thus obtained with an electrically non-conductive resin.

FIG. 5-D corresponds to a planarizing step implemented in the prior-art solution, the planarizing step consisting in planarizing the two surface layers 101 of the multilayer printed circuit board 10.

FIG. 5-E illustrates a depositing step implemented in the prior-art solution, the depositing step consisting in depositing an electrically conductive layer 100 on the two previously planarized surface layers 101. The depositing step in particular allows the counterbored hole 202 to be occulted in order to prevent parasitic electromagnetic radiation from propagating out of the counterbored hole 202 and/or from penetrating into the counterbored hole 202. FIG. 5-E further illustrates another implementation of the hole-boring and -metallizing step (a similar step was described with reference to FIG. 6-A) to produce a metallized through-hole 201. A metallized through-hole 201 can only be produced according to the prior-art solution after the counterbored holes 202 have been filled and plugged. This makes it possible to avoid filling the metallized through-holes 201 with electrically non-conductive resin.

FIG. 5-F illustrates an etching step implemented in the prior-art solution, the etching step consisting in producing electrical tracks 302 and/or connection pads 303 on one or both surface layers 101. The etching step in particular allows the metallization occulting each counterbored hole 202 to be electrically insulated.

FIG. 5-G illustrates a step of adding electronic components 304 that is implemented in the prior-art solution, the step of adding electronic components 304 consisting in joining electronic components 304 to one or both surface layers 101. More precisely, each electronic component 304 may be joined to two or more dedicated connection pads 303.

FIG. 6-C corresponds to an etching step that consists in producing electrical tracks 302 and/or connection pads 303 on one or both surface layers 101, this etching step following directly on from the previous manufacturing steps according to embodiments of the invention.

FIG. 6-D corresponds to a step of adding electrical components consisting in joining electronic components 304 to one or both surface layers 101. The electronic components 304 joined in this step include metal pads 301 intended to occult the counterbored holes 202. The metal pads 301 may therefore be joined to the surface layers 101 in a similar way to any other surface-mount electronic component 304.

The embodiments of the invention thus allow electrical isolation of counterbored holes 202 to be achieved with fewer manufacturing steps than prior-art solutions and therefore ensure a better manufacturing yield. Furthermore, the embodiments of the invention allow electrical isolation of counterbored holes 202 without requiring such counterbored holes 202 to be filled with a non-conductive resin. This makes it possible to achieve a weight saving for example. Moreover, contrary to the prior-art solutions, which require an additional step of depositing a conductive layer 100 (FIG. 5-E) on the one or more surface layers 101 in order to occult the counterbored holes 202, the embodiments of the invention allow the initial thickness of the conductive surface layers 100 to be preserved, this allowing an improvement in terms of etching precision and in terms of weight.

The invention is not limited to the embodiments described above by way of non-limiting example. In particular, the invention is not limited to the examples of electronic systems mentioned in the description. It encompasses any variant embodiment envisionable by those skilled in the art.

The invention claimed is:

1. A multilayer printed circuit board intended to connect electronic components, the multilayer printed circuit board comprising a stack of a plurality of conductive layers, the conductive layers comprising two surface layers and one or more internal layers, separation between two neighbouring conductive layers being ensured by means of an electrically insulating layer, the printed circuit board comprising one or more counterbored holes, each counterbored hole being configured to electrically connect one of the two surface layers to one or more internal layers and comprising a portion with metallization opening onto one of the two surface layers and a portion without metallization opening onto the other surface layer, the portion with metallization and the portion without metallization of a counterbored hole extending in a direction perpendicular to a layer stacking plane, wherein the multilayer printed circuit board further comprises one or more metal pads, each metal pad being joined to one of the two surface layers so as to occult the portion without metallization of a corresponding counterbored hole.

2. The multilayer printed circuit board according to claim 1, wherein parasitic electromagnetic radiation is liable to form inside said counterbored holes, and in that said metal pads are chosen so as to block, at least partially, propagation of said parasitic electromagnetic radiation out of said counterbored holes.

3. The multilayer printed circuit board according to claim 1, wherein parasitic electromagnetic radiation is liable to penetrate into said counterbored holes, and in that said metal pads are chosen so as to block, at least partially, propagation of said parasitic electromagnetic radiation into said counterbored holes.

4. The multilayer printed circuit board according to claim 2, wherein geometric properties of a metal pad are chosen depending on one or more characteristics of the parasitic electromagnetic radiation liable to form in and/or penetrate into the corresponding counterbored hole.

5. The multilayer printed circuit board according to claim 2, wherein electrical properties of a metal pad are chosen depending on one or more characteristics of the parasitic electromagnetic radiation liable to form in and/or penetrate into the corresponding counterbored hole.

6. The multilayer printed circuit board according to claim 1, wherein said metal pads are identical.

7. The multilayer printed circuit board according to claim 1, wherein said metal pads are passive components not requiring an electrical power supply.

8. A process for manufacturing a multilayer printed circuit board and adding components, the multilayer printed circuit board being intended to connect electronic components, comprising the steps of:
producing a stack of a plurality of conductive layers, the conductive layers comprising two surface layers and one or more internal layers, separation between two neighbouring conductive layers being ensured by means of an insulating layer;
producing electrical connections between said conductive layers by means of one or more metallized through-holes;
converting at least one metallized through-hole into a counterbored hole, without filling the counterbored hole with a resin plug, the counterbored hole comprising a portion with metallization opening onto one of the two surface layers and a portion without metallization opening onto the other surface layer, the portion with metallization and the portion without metallization of a counterbored hole extending in a direction perpendicular to a layer stacking plane;
producing electrical tracks and connection pads on at least one of the two surface layers.

9. The process for manufacturing a multilayer printed circuit board and adding components according to claim 8, further comprising steps of:
joining one or more metal pads to one or both surface layers, each metal pad being joined so as to occult the portion without metallization of a corresponding counterbored hole;
joining one or more electronic components to connection pads belonging to one or both surface layers.

* * * * *